United States Patent
Van Der Zaag et al.

(10) Patent No.: US 6,323,533 B1
(45) Date of Patent: Nov. 27, 2001

(54) SEMICONDUCTOR DEVICE WITH AN OPERATING FREQUENCY LARGER THAN 50 MHZ COMPRISING A BODY COMPOSED OF A SOFT FERRITE MATERIAL

(75) Inventors: Pieter Jan Van Der Zaag; Ronald Dekker; Wilhelmus Mathias Clemens Dolmans, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/556,547

(22) Filed: Apr. 24, 2000

(30) Foreign Application Priority Data

Apr. 23, 1999 (EP) .................................................. 99201281

(51) Int. Cl.$^7$ .................................................. H01L 29/00
(52) U.S. Cl. .......................... 257/528; 257/275; 257/295; 257/379; 257/664
(58) Field of Search .................................... 257/215, 528, 257/531, 664, 275, 277, 276, 379

(56) References Cited

U.S. PATENT DOCUMENTS 6,136,458 * 10/2000 Inoue .................................. 428/693

FOREIGN PATENT DOCUMENTS

| | | |
|---|---|---|
| 02196405-A | * 8/1990 | (JP) . |
| 05082736-A | * 4/1993 | (JP) . |
| 07153912 | 6/1995 | (JP) . |
| 9613858A2 | 5/1996 | (WO) . |
| 9616443A1 | 5/1996 | (WO) . |
| 9620497A1 | 7/1996 | (WO) . |

* cited by examiner

*Primary Examiner*—Nathan Flynn
*Assistant Examiner*—Remmon R. Forde
(74) *Attorney, Agent, or Firm*—Steven R. Biren

(57) ABSTRACT

A semiconductor device (1) with an operating frequency above 50 MHz comprises a body (2) composed of a soft ferrite material, which body (2) has a surface (3) to which a semiconductor element (4), a pattern of conductors (5,6) and a passive element in the form of a planar inductor (7) are fastened by means of a layer (8) of adhesive. In order to reduce the manufacturing costs of the semiconductor device without adversely affecting the performance of the semiconductor device performance, a soft ferrite material is applied having a ferromagnetic resonance frequency smaller than the operating frequency of the semiconductor device.

8 Claims, 6 Drawing Sheets

SEMICONDUCTOR DEVICE WITH AN OPERATING FREQUENCY LARGER THAN 50 MHZ COMPRISING A BODY COMPOSED OF A SOFT FERRITE MATERIAL

BACKGROUND OF THE INVENTION

The invention relates to a semiconductor device with an operating frequency above 50 MHz comprising a body composed of a soft ferrite material, said body having a surface to which a semiconductor element, a pattern of conductors and a passive element are fastened, which passive element is shaped like an inductor.

Such a semiconductor device can be used as a receiver for application in radio apparatus (about 100 MHz), television apparatus (about 450 to 860 MHz) and mobile telephone apparatus (about 900 MHz). In practice, the semiconductor device may comprise many active and passive elements, which active elements may be arranged in an integrated circuit comprising a very large number of transistors, and which passive elements may comprise besides one or several inductors, for example, capacitors and resistors.

A semiconductor device of the kind mentioned in the opening paragraph is known from published patent application WO 96/13858. The known semiconductor device is suitable for processing microwave signals and comprises a body composed of ferrite material, which body of ferrite material advantageously influences the performance of the inductor compared to a body composed of glass.

The performance of an inductor is often measured in terms of the quality factor Q, which is defined as the inductive reactance $\omega L$, with $\omega$ being the angular frequency and L the inductance, divided by the total resistance R. From a theoretical article entitled "Planar inductors on magnetic substrates", written by Roshen and published in IEEE Transactions on Magnetics, Vol. 26, No. 1 (1990), pp. 270–275, it is known that the use of a magnetic carrier body might result in a 100 percent enhancement in inductance and, hence, in the quality factor of an inductor compared to a non-magnetic carrier body, provided that the magnetic carrier body has a magnetic permeability much larger than one.

As the quality factor Q of an inductor is proportional to the typical width (e.g. diameter) of the inductor, which may be, for instance, a substantially circular, square or rectangular spiral, a doubling of the quality factor can be turned into a saving in inductor surface area of approximately 75%. Considering a typical surface area of an inductor of the order of 1 $mm^2$, it is evident that a saving of 75% in inductor surface area strongly influences the total number of semiconductor devices that can be manufactured per unit of surface area.

In order to attain the above-mentioned doubling of the quality factor of an inductor to be integrated in a semiconductor device with an operating frequency above 50 MHz, generally a soft ferrite material is selected which is capable of following the alternations of the magnetic field at the operating frequency of the semiconductor device. This is supported by the statement given in a standard textbook entitled "Soft ferrites: properties and applications", second edition, written by E. C. Snelling and published by Butterworths, London (1988), p. 90, that the useful frequency range of a ferrite is limited by the onset of ferromagnetic resonance, either because the permeability begins to fall or, at a somewhat lower frequency, the losses rise steeply.

A disadvantage of a semiconductor device of the type mentioned above, in which a soft ferrite material is applied which is capable of following the alternations of the magnetic field at the operating frequency of the semiconductor device, is that its manufacturing costs are high owing to the high initial costs of the soft ferrite material applied.

SUMMARY OF THE INVENTION

It is an object of the invention to provide a semiconductor device of the kind mentioned in the opening paragraph, in which a soft ferrite material is applied which brings about an enhancement in inductance and, hence, in the quality factor of the integrated inductor compared to glass, and allows manufacture of the semiconductor device at moderate costs.

According to the invention, this object is achieved in that the soft ferrite material has a ferromagnetic resonance frequency smaller than the operating frequency of the semiconductor device. Surprisingly, it has been found that by using a soft ferrite material, which is not capable of following the alternations of the magnetic field at the operating frequency of the semiconductor device, the inductance and, hence, the quality factor of an inductor are almost doubled. The initial costs of soft ferrite materials in general decrease with decreasing ferromagnetic resonance frequency. Soft ferrite materials with a lower ferromagnetic resonance frequency are generally less fine-grained, and need less processing during preparation, and/or are generally poorer in expensive metals such as, for instance, nickel, magnesium and manganese. This means that a less expensive soft ferrite material can be applied in a semiconductor device with an operating frequency above 50 MHz, thereby giving rise to a significant reduction of the manufacturing costs of the semiconductor device without reducing the semiconductor device's performance.

The selection of the soft ferrite material employed in the semiconductor device in accordance with the invention is contrary to the teaching of the above-mentioned statement by E. C. Snelling in the standard textbook "Soft ferrites: properties and applications", second edition, Butterworths, London (1988), p. 90, which statement teaches that a person skilled in the art would select a soft ferrite material having a ferromagnetic resonance frequency lying above the operating frequency of the semiconductor device, that is to say a soft ferrite material which is capable of following the alternations of the magnetic field at the operating frequency of the semiconductor device. Such a soft ferrite material has unnecessarily high initial costs and, hence, gives rise to unnecessarily high manufacturing costs of the semiconductor device.

In order to further improve the inductance and, hence, the quality factor of the inductor, it is advantageous to select a soft ferrite material having a magnetic permeability larger than about 5 at the operating frequency of the semiconductor device.

If the inductor is disposed on a relatively highly conductive body of soft ferrite material, electric currents are induced in the body of soft ferrite material by the magnetic field of the inductor. These electric currents, which are free to flow in the above-mentioned conductive body, cause extra resistance losses and a decrease in inductance and, hence, in the quality factor of the inductor. In order to counteract these resistance losses, it is therefore advantageous to apply a soft ferrite material with an electric resistivity larger than about $10^3$ $\Omega m$.

The category of soft ferrite materials with an electric resistivity larger than about $10^3$ $\Omega m$ comprises, for instance, some MnZn-ferrites, NiZn-ferrites and MgZn-ferrites, which ferrites are of the spinel-type and have the general chemical formula $Me_x Zn_{(1-x)} Fe_2 O_{4\pm\delta}$, with Me representing either Mn, Ni or Mg, x representing the fraction of Me of the total of Me and Zn, which lies between 0 and 1, and δ representing the off-stoichiometry of the ferrite, which is typically smaller than or equal to 0.05. The ferrites advantageously possess a slight Fe-deficiency, as this suppresses the presence of $Fe^{2+}$ ions, which ions in general lead to increased eddy-current losses. From the above-mentioned category of soft ferrite materials, a NiZn-ferrite or a MgZn-ferrite is advantageously selected, as these types of soft ferrite materials can be comparatively easily manufactured with a resistivity larger than about $10^3$ Ωm.

In order to facilitate the manufacture of a semiconductor device in accordance with the invention, the inductor is advantageously produced in substantially planar form.

The inductor may be shaped like, for instance, a substantially square or rectangular spiral. However, the inductor preferably has the shape of a substantially circular spiral, since the use of a circular inductor leads to a quality factor that is about 20% higher than that of a square or rectangular inductor occupying the same surface area.

Although copper, silver or gold may be used, the inductor advantageously comprises aluminum, either pure or as an alloy with a few percent of silicon and/or copper, as this metal is generally compatible with the processing of conductors, which are commonly also composed of pure or alloyed aluminum.

A further embodiment of the semiconductor device in accordance with the invention is characterized in that the semiconductor element, the pattern of conductors and the passive element are fastened to the surface of the body composed of the soft ferrite material by means of a layer of adhesive.

BRIEF DESCRIPTION OF THE DRAWINGS

These and other aspects of the invention will be apparent from and elucidated with reference to the embodiments described hereinafter and shown in the drawing. In the drawing.

DESCRIPTION OF THE PREFERRED EMBODIMENTS

Figure 1:
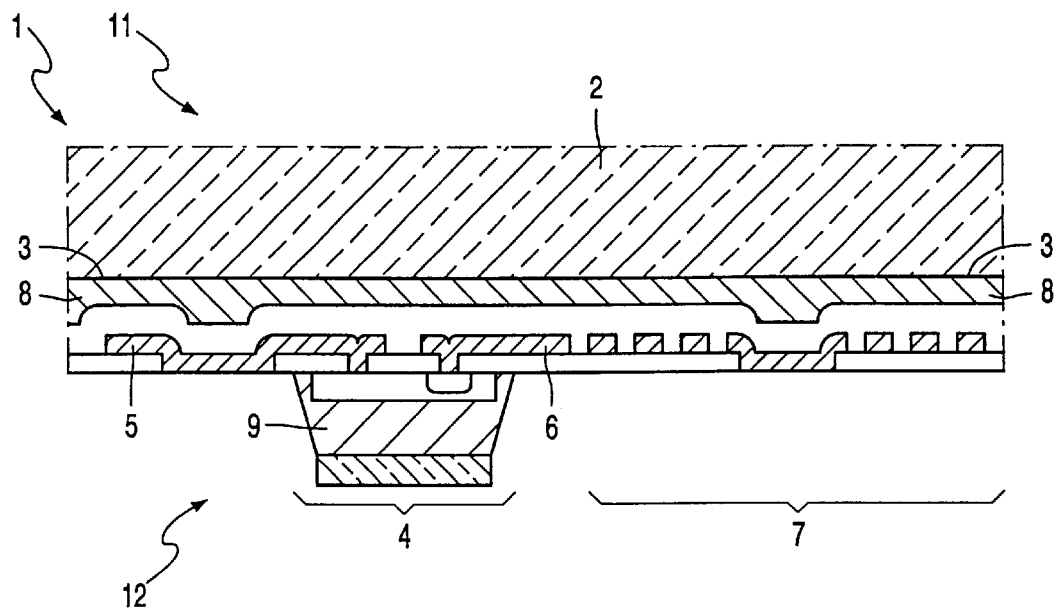
FIG. 1 shows in a diagrammatic cross-sectional view a first embodiment of the semiconductor device in accordance with the invention.
Figure 2:
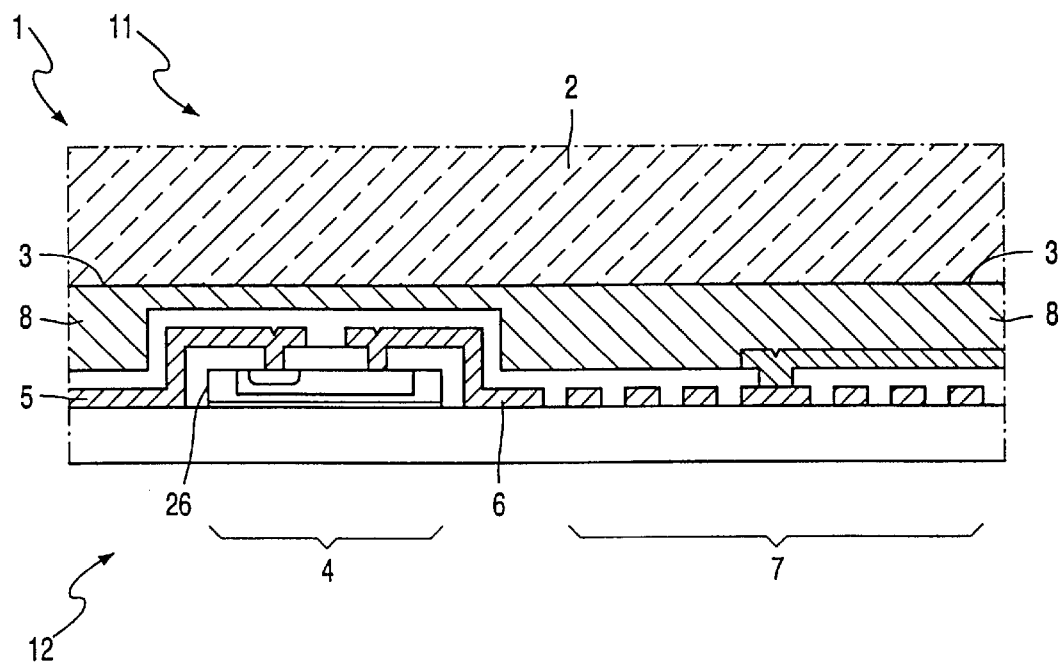
FIG. 2 shows in a diagrammatic cross-sectional view a second embodiment of the semiconductor device in accordance with the invention.

FIGS. 1 and 2 show in diagrammatic cross-sectional views two different embodiments of a semiconductor device 1 with an operating frequency above 50 MHz, which semiconductor device 1 comprises a body 2 composed of a soft ferrite material having a surface 3 to which a semiconductor element 4, a pattern of conductors 5,6 and a passive element in the form of a planar inductor 7 are fastened by means of a layer 8 of adhesive.

For the sake of clarity, only a single semiconductor element 4 and a single passive element, in the form of the planar inductor 7, are shown. The semiconductor element 4, also called active element hereinafter, is a bipolar transistor in the present example, but may also be, for instance, a field-effect transistor or a diode. The planar inductor 7 may be a substantially square or rectangular spiral, however, it advantageously has the form of a substantially circular spiral. The pattern of conductors 5,6 electrically connects the semiconductor element 4 to the planar inductor 7 and enables electrical contact to the external world.

In practice, the semiconductor device 1 may comprise many such active and passive elements, which active elements may be arranged in an integrated circuit comprising a very large number of transistors, and which passive elements may comprise besides one or several planar inductors, for example, capacitors and resistors. The pattern of conductors 5,6 will then electrically connect the active elements in the integrated circuit both to one another and to the passive elements.

Such a semiconductor device can be used as a receiver for application in radio apparatus (about 100 MHz), television apparatus (about 450 to 860 MHz) and mobile telephone apparatus (about 900 MHz).

Figure 3:
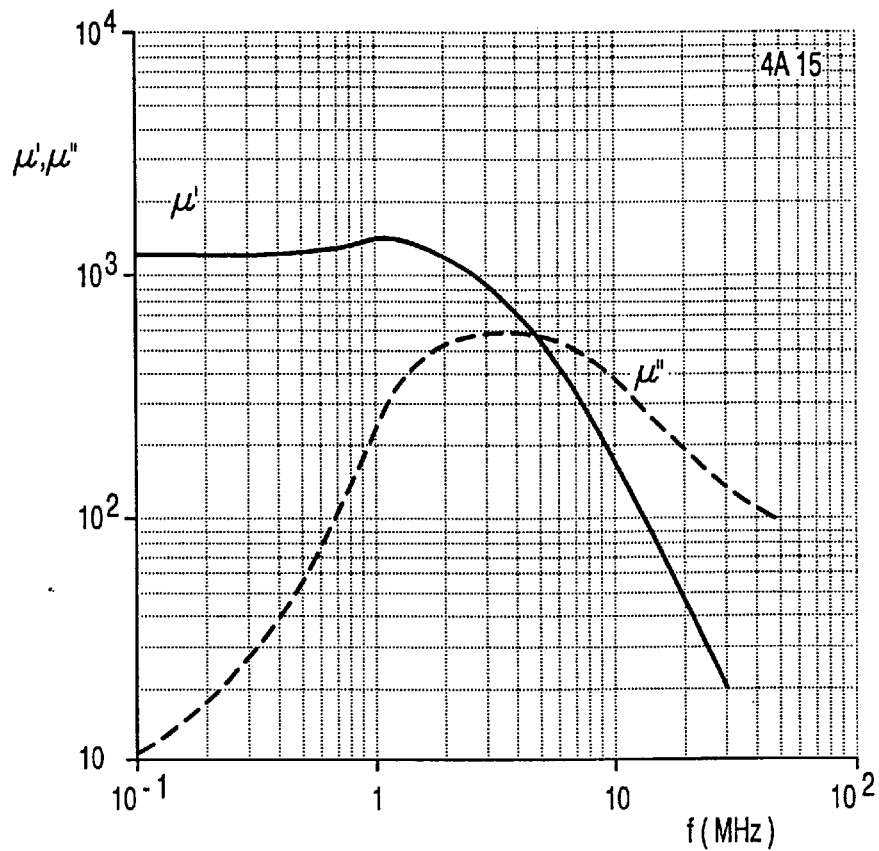
FIGS. 3 to 5 show magnetic spectra of soft ferrite materials 4A15, 4F1 and 4E1, as taken from the Philips Components data handbook MA01 entitled "Soft Ferrites" (1998), which soft ferrite materials are applicable in a semiconductor device in accordance with the invention.
Figure 4:
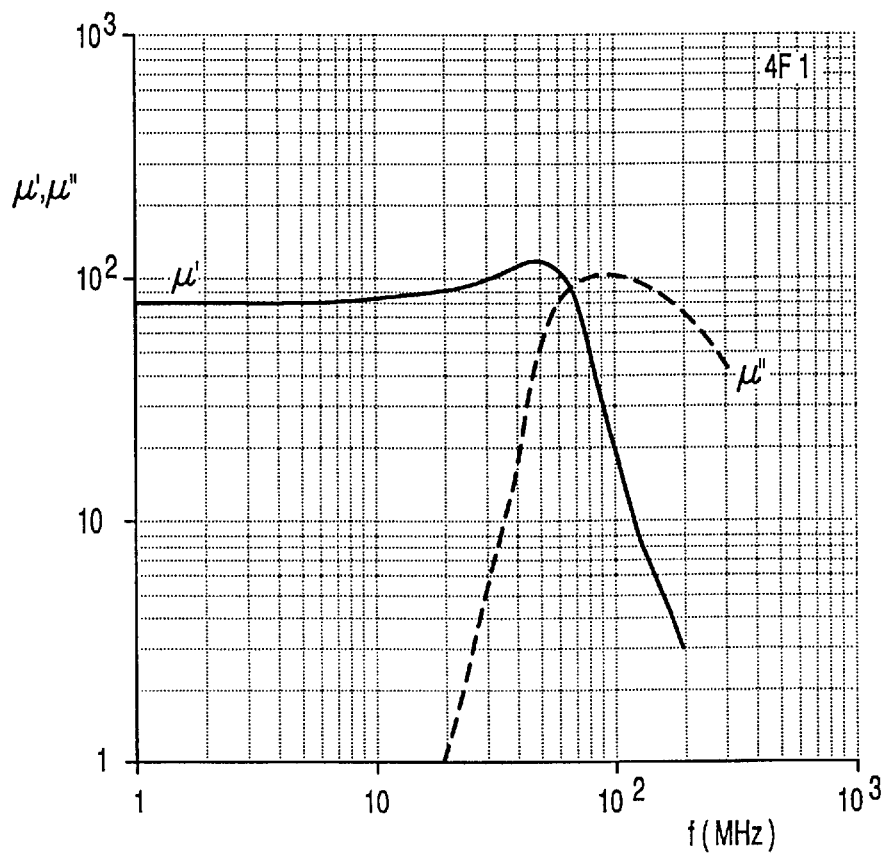
Figure 5:
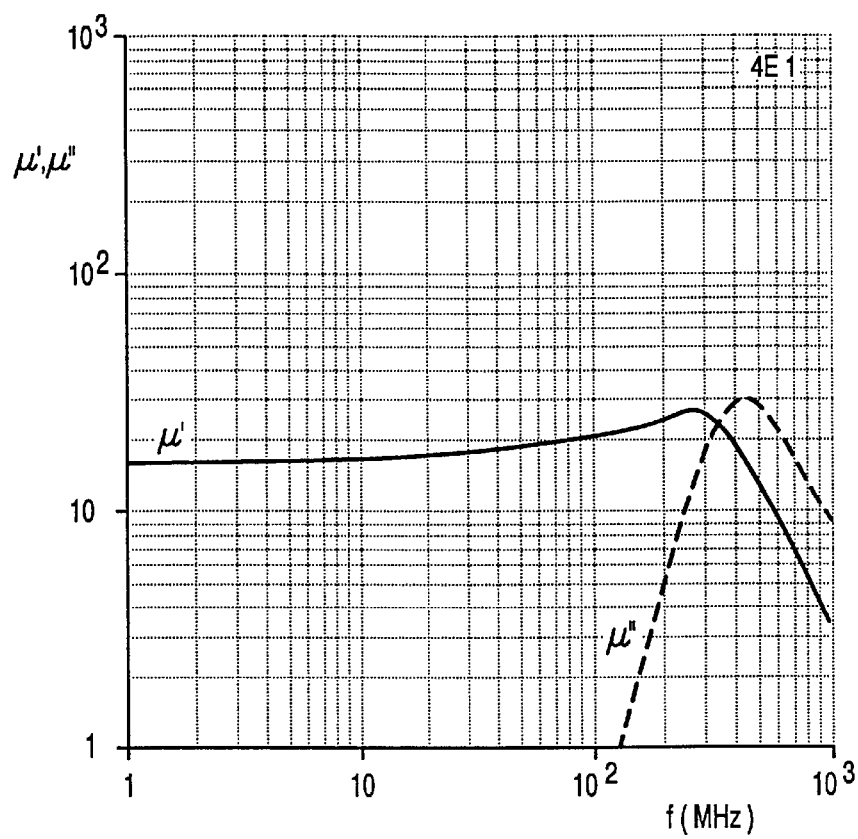

FIGS. 3 to 5 show magnetic spectra of soft ferrite materials 4A15, 4F1 and 4E1, as taken from the Philips Components data handbook MA01 entitled "Soft Ferrites" (1998), which soft ferrite materials are applicable in semiconductor devices such as shown in FIGS. 1 and 2.

The magnetic spectra present the real part ($\mu'$) and the imaginary part ($\mu''$) of the magnetic permeability ($\mu$) as a function of the frequency (f in MHz). The general characteristic of the spectra is that the real part ($\mu'$), being representative of the inductance, remains constant in a certain frequency range, while at larger frequencies, after a small rise, it drops fairly rapidly to a very small value. The imaginary part ($\mu''$), being 90° out of phase with respect to the real part ($\mu'$) and being representative of the dissipation, is at a maximum at the frequency at which the real part ($\mu'$) has just started to drop. The frequency at which the imaginary part ($\mu''$) is at a maximum is in general referred to as the ferromagnetic resonance frequency. The spectra reveal that the resonance frequencies of the soft ferrite materials 4A15, 4F1 and 4E1 are about 5 MHz, 90 MHz and 450 MHz, respectively. In general, the higher the ferromagnetic resonance frequency of a soft ferrite material, the higher its costs are.

Figure 6:
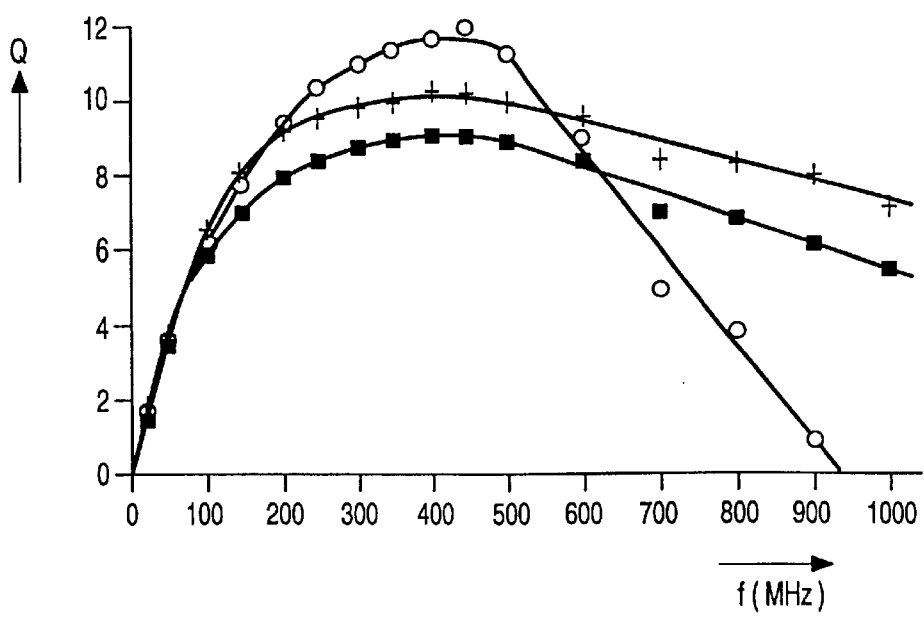
FIG. 6 shows a graph of the relationship between the quality factor (Q) and the frequency (f in MHz) up to 1000 MHz for three planar inductors, two of them being provided on a body of a soft ferrite material to be used in a semiconductor device in accordance with the invention, namely 4F1 (squares) and 4E1 (crosses), and the other being provided on a body of glass (circles).

FIG. 6 shows a graph of the relationship between the quality factor (Q) and the frequency (f in MHz) up to 1000 MHz for three planar inductors, which are substantially circular spirals comprising aluminum and having an inductance of about 30 nH, two of them having a surface area of about 0.8 mm² and being provided on a body of a soft ferrite material, namely 4F1 (squares) and 4E1 (crosses), and the other being provided on a body of glass (circles), while having a surface area which is four times that of the planar inductors provided on soft ferrite material. Hence, the doubling of the quality factor owing to the use of a soft ferrite material instead of glass, which is a non-magnetic material, has already been discounted for by reducing the surface area of the planar inductors disposed on soft ferrite material with 75%. The exact values of the inductance are 31.5 nH, 28.4 nH and 33.0 nH for, respectively, 4F1, 4E1 and glass. The number of turns is 5 in the case of 4F1 and 4E1, and 6 in the case of glass. Moreover, the width of the turns is 48 μm in the case of 4F1 and 4E1, and 98.5 μm in the case of glass. Finally, the spacing between the turns is 5 μm in all three cases.

FIG. 6 shows that up to a frequency of about 500 MHz, the quality factor of the planar inductors disposed on soft ferrite material, namely 4F1 (squares) with a ferromagnetic resonance frequency of about 90 MHz and 4E1 (crosses) with a ferromagnetic resonance frequency of about 450 MHz, is about equal to the quality factor of the planar inductor disposed on glass (circles). As the surface area of the planar inductor disposed on glass is four times the surface area of the planar inductors disposed on soft ferrite material, it is clear that the quality factor can be almost doubled by using the above-mentioned soft ferrite materials instead of glass. Above about 500 MHz, the quality factor of the planar inductor disposed on glass drops much more rapidly as the frequency increases than the quality factor of the planar inductors disposed on soft ferrite material. This can be attributed to the fact that, above about 500 MHz, a larger capacitance starts to dominate the performance of the planar inductor disposed on glass owing to the larger surface area occupied by the turns which make up this inductor. As a result, the quality factor of the planar inductor disposed on glass becomes significantly smaller than that of the planar inductors disposed on soft ferrite material in the frequency range above about 500 MHz.

Figure 7:
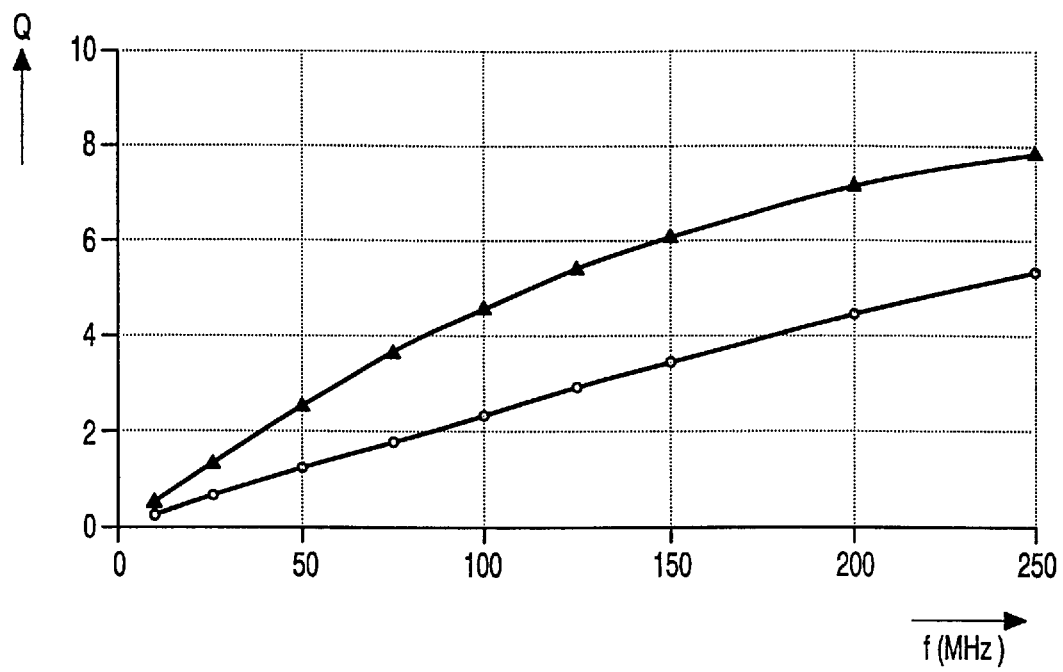
FIG. 7 shows a graph of the relationship between the quality factor (Q) and the frequency (f in MHz) up to 250 MHz for two planar inductors, one of them being provided on a body of a soft ferrite material to be used in a semiconductor device in accordance with the invention, namely 4A15 (triangles), and the other being provided on a body of glass (circles).

FIG. 7 shows a graph of the relationship between the quality factor (Q) and the frequency (f in MHz) up to 250 MHz for two planar inductors, which are substantially circular spirals comprising aluminum, one of them being provided on a body of a soft ferrite material, namely 4A15 (triangles), and having an inductance of 12.0 nH, and the other being provided on a body of glass (circles) and having an inductance of 6.1 nH. It is to be noted that the surface area of the planar inductor disposed on soft ferrite material has not been reduced by 75% compared to that of the planar inductor disposed on glass. Both inductors have a surface area of about 0.8 mm². The number of turns is 3 in the case of both 4A15 and glass. Moreover, the width of the turns as well as the spacing between the turns is 50 μm in both cases.

It is clear that up to a frequency of about 200 MHz, even soft ferrite material 4A15 (triangles), which possesses a ferromagnetic resonance frequency of only about 5 MHz, brings about an enhancement of the quality factor of approximately 100 percent compared to glass (circles). Above this frequency, the enhancement of the quality factor starts to gradually decrease with increasing frequency.

The results presented in FIGS. 6 and 7 reveal that the soft ferrite materials denoted by 4A15, 4F1 and 4E1 bring about an enhancement of the quality factor of approximately 100 percent compared to glass, when used at frequencies above their respective resonance frequencies of about 5 MHz, 90 MHz and 450 MHz, that is to say at frequencies at which these materials are not capable of following the alternations of the magnetic field.

It will be evident that, besides the above-mentioned soft ferrite materials, other soft ferrite materials can be advantageously applied, provided their ferromagnetic resonance frequency is smaller than the operating frequency of the semiconductor device in which they are applied. Examples of other applicable soft ferrite materials are, for instance, those denoted by 4A11, 3S3 and 2A3 in the Philips Components data handbook MA01 entitled "Soft Ferrites" (1998).

In order to further improve the inductance and, hence, the quality factor of the inductor, it is advantageous to select a soft ferrite material with a magnetic permeability larger than about 5 at the operating frequency of the semiconductor device. The data presented in FIGS. 4 and 5 reveal that at about 900 MHz the magnetic permeability ($\mu$) of the soft ferrite materials 4F1 and 4E1 amounts to about 9 and 11, respectively, the magnetic permeability being calculated as the square root of the real part ($\mu'$) squared plus the imaginary part ($\mu''$) squared. The value of the soft ferrite material 4F1 has been obtained after extrapolation. Although the real parts ($\mu'$) have dropped to relatively small values at about 900 MHz, the quality factors (Q) still have values between 6 and 8 at this frequency (FIG. 6), which is very surprising, as the values of the magnetic permeability ($\mu$) at this frequency are almost completely determined by the values of the imaginary part ($\mu''$).

Furthermore, in order to suppress the occurrence of resistance losses to the body of soft ferrite material and a decrease in inductance and, hence, in the quality factor of the inductor, it is preferred to apply a soft ferrite material having an electric resistivity larger than about $10^3$ Ωm. The category of soft ferrite materials with an electric resistivity larger than about $10^3$ Ωm comprises, for instance, some MnZn-ferrites, NiZn-ferrites and MgZn-ferrites, which ferrites are of the spinel-type and have the general chemical formula $Me_x Zn_{(1-x)} Fe_2 O_{4\pm\delta}$, with Me representing either Mn, Ni or Mg, x representing the fraction of Me of the total of Me and Zn, which lies between 0 and 1, and δ representing the off-stoichiometry of the ferrite, which is typically smaller than or equal to 0.05. From this category, a NiZn-ferrite or a MgZn-ferrite is advantageously selected, as these types of soft ferrite materials can be comparatively easily manufactured with a resistivity larger than about $10^3$ Ωm.

In the manufacture of the semiconductor device 1 as depicted in FIGS. 1 and 2, process steps, yet to be described, preceding the fastening of the semiconductor element 4, the pattern of conductors 5,6 and the planar inductor 7 to the body 2 of soft ferrite material by means of the layer 8 of adhesive are carried out in a standard clean-room environment, whereas the fastening itself and process steps following the fastening are preferably carried out outside such an environment in a less clean space equipped for final mounting. A standard clean-room is generally equipped with very expensive deposition and photo-lithographic equipment, which is not required in the space for final mounting in the manufacture of the semiconductor device in accordance with the invention.

Figure 8:
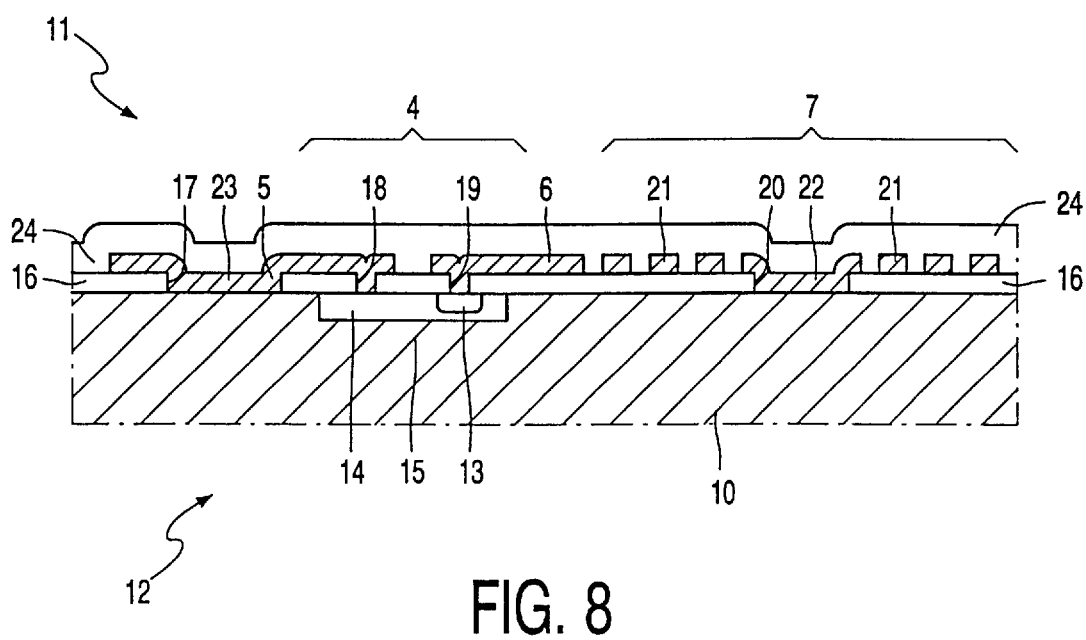
FIGS. 8 and 9 show in diagrammatic cross-sectional views successive stages in the manufacture of the semiconductor device as shown in FIG. 1, FIGS. 10 to 12 show in diagrammatic cross-sectional views successive stages in the manufacture of the semiconductor device as shown in FIG. 2.
Figure 9:
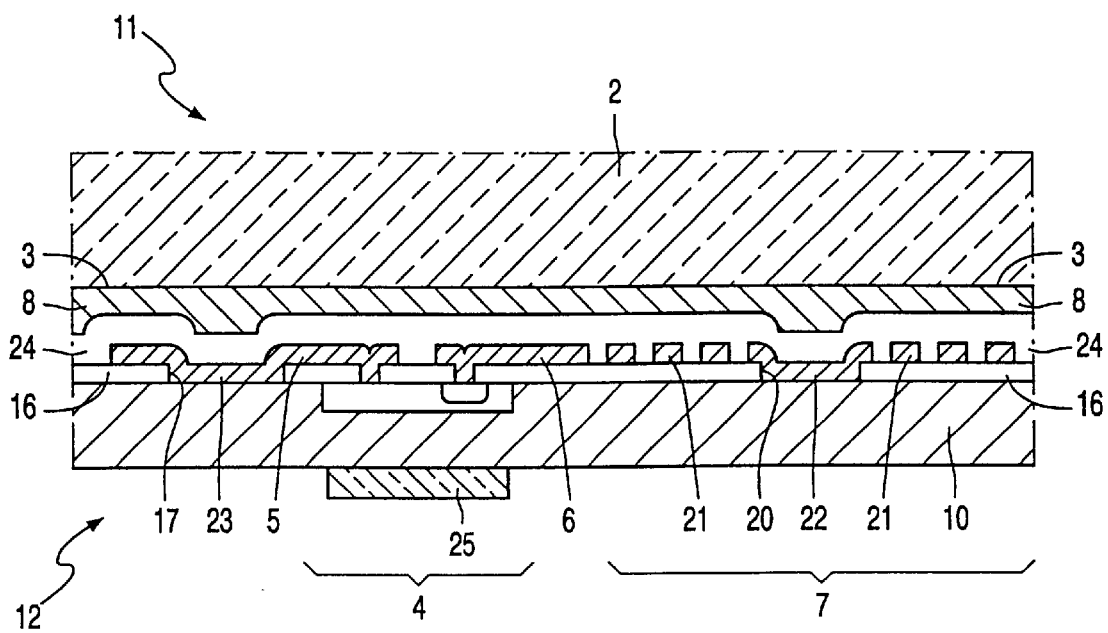

FIGS. 8 and 9 show in diagrammatic cross-sectional views successive stages in the manufacture of the semiconductor device 1 as shown in FIG. 1, having a body 2 of a soft ferrite material, which body 2 is provided at a surface 3 with a planar inductor 7, a pattern of conductors 5,6 and a semiconductor element 4, which semiconductor element 4 is formed in a so-called mesa 9 of semiconductor material. In the present example, the semiconductor device 1 is manufactured as a receiver for application in mobile telephone apparatus having an operating frequency of about 900 MHz.

The manufacture starts (FIG. 8) with a body 10 of semiconductor material, in the present example a silicon body of n-type conductivity. The body 10 of semiconductor material is provided at a first side 11 with the semiconductor element 4, in the present example a bipolar transistor with an n-type emitter zone 13, a p-type base zone 14, and an n-type collector zone 15, which collector zone is provided by a portion of the body 10 of semiconductor material situated below the base zone 14.

An insulating layer 16 composed of, for instance, silicon oxide is provided at the first side 11 of the body 10 of semiconductor material, in which insulating layer 16 windows 17,18,19,20 are etched. A layer of conductive material is deposited on the insulating layer 16 and in the windows 17,18,19,20, which layer of conductive material is etched in a usual way to form the pattern of conductors 5,6. In this respect, aluminum, tungsten, copper or molybdenum, or a combination of metals may be used. Such a metal is advantageously applied on top of a layer acting as adhesion layer and/or barrier layer. In this respect titanium (Ti) may be applied as adhesion layer, and titanium nitride (TiN) or titanium tungsten (TiW) as barrier layer. The planar inductor 7, in the present example a substantially circular spiral having a surface area of about 0.8 mm$^2$, may be formed in another layer of conductive material comprising, for instance, aluminum, copper, silver or gold, but is advantageously formed in the same layer of conductive material as the pattern of conductors 5,6, since no additional process steps are needed then. Aluminum, either pure or as an alloy with a few percent of silicon and/or copper, is advantageously applied in that case. The planar inductor 7 comprises turns 21, in the present example 5 turns 21 spaced apart about 5 $\mu$m and having a width of about 50 $\mu$m, and an end portion 22 situated within the window 20 on the body 10 of semiconductor material. The conductor 5 comprises a contact portion 23 situated within the window 17 on the body 10 of semiconductor material.

After the planar inductor 7, the pattern of conductors 5,6 and the semiconductor element 4 have been formed at the first side 11 of the body 10 of semiconductor material, a further insulating layer 24 composed of, for instance, silicon oxide is applied, whereupon the body 10 of semiconductor material is fastened with the first side 11 to the body 2 composed of a soft ferrite material by means of the layer 8 of adhesive, which may be, for instance, an epoxy or acrylate glue (FIG. 9). In the present example, the soft ferrite material is selected to be 4E1, which is a NiZn-ferrite having a ferromagnetic resonance frequency of about 450 MHz, a magnetic permeability of about 11 at the operating frequency of the semiconductor device 1 of about 900 MHz and an electric resistivity of about $10^5$ $\Omega$m. It will be evident from the foregoing that other soft ferrite materials are applicable as well, provided their ferromagnetic resonance frequency is smaller than the operating frequency of the semiconductor device which, in the present example, is a receiver with an operating frequency of about 900 MHz for application in mobile telephone apparatus.

Then, the body 10 of semiconductor material is subjected at the opposed, second side 12 to a material removing treatment until the semiconductor material is removed, except at the area of the semiconductor element 4, as shown in FIG. 1. This can be achieved by providing the body 10 of semiconductor material at the second side 12 with an etching mask 25 at the area of the semiconductor element 4, which etching mask 25 may be formed by depositing and etching a layer of, for instance, silicon nitride, and subsequently removing the exposed semiconductor material, in the present example silicon, by means of etching with a KOH solution until the insulating layer 16, in the present example composed of silicon oxide, is exposed. Etching automatically stops at the insulating layer 16. Thus, of the body 10 of semiconductor material, only the mesa 9 of semiconductor material remains at the area of the semiconductor element 4, as shown in FIG. 1.

As etching takes place relatively slowly, the removal of the semiconductor material of the body 10 may be advantageously accelerated by maskless removal of the body 10 of semiconductor material over part of its thickness before applying the etching mask 25, the result of which is actually shown in FIG. 9, and subsequently etching the exposed semiconductor material. This maskless removal can be advantageously carried out by means of chemical-mechanical polishing.

In all cases, the semiconductor material of the body 10 has been removed at the area of the planar inductor 7, which advantageously affects the quality factor of the planar inductor 7.

In order to protect the conductive material of the end portion 22 situated in the window 20 and that of the contact portion 23 situated in the window 17 during etching of the semiconductor material, a silicon nitride layer (not shown) may be advantageously applied at the first side 11 of the body 10 of semiconductor material before the pattern of conductors 5,6 and the turns 21 of the planar inductor 7 are formed. This silicon nitride layer obviously has to be removed after the removal of the semiconductor material of the body 10 so as to expose the end portion 22 of the planar inductor 7 and the contact portion 23 of the conductor 5 for the purpose of external contacting.

Figure 10:
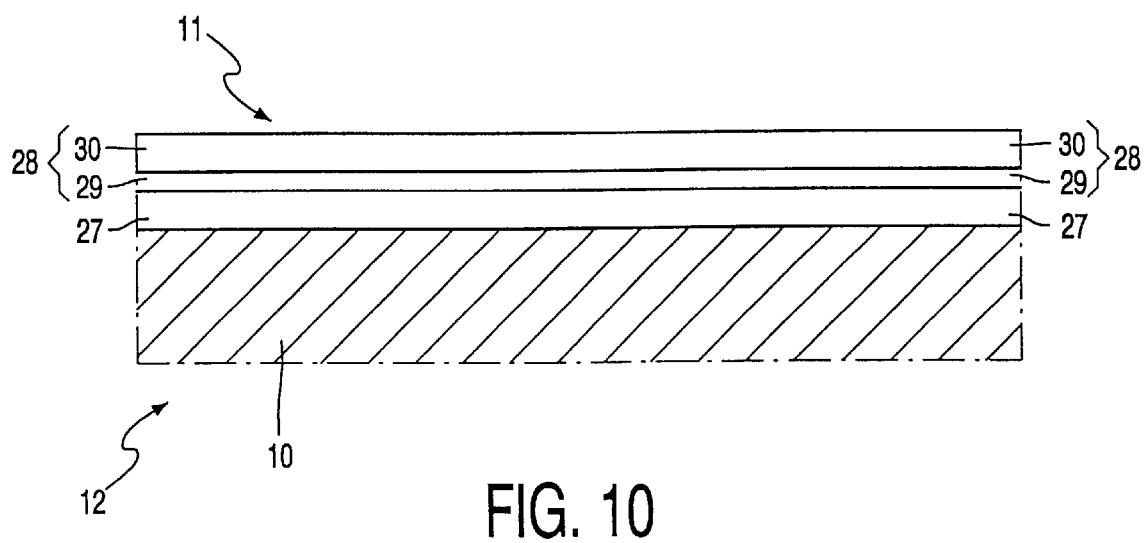
Figure 11:
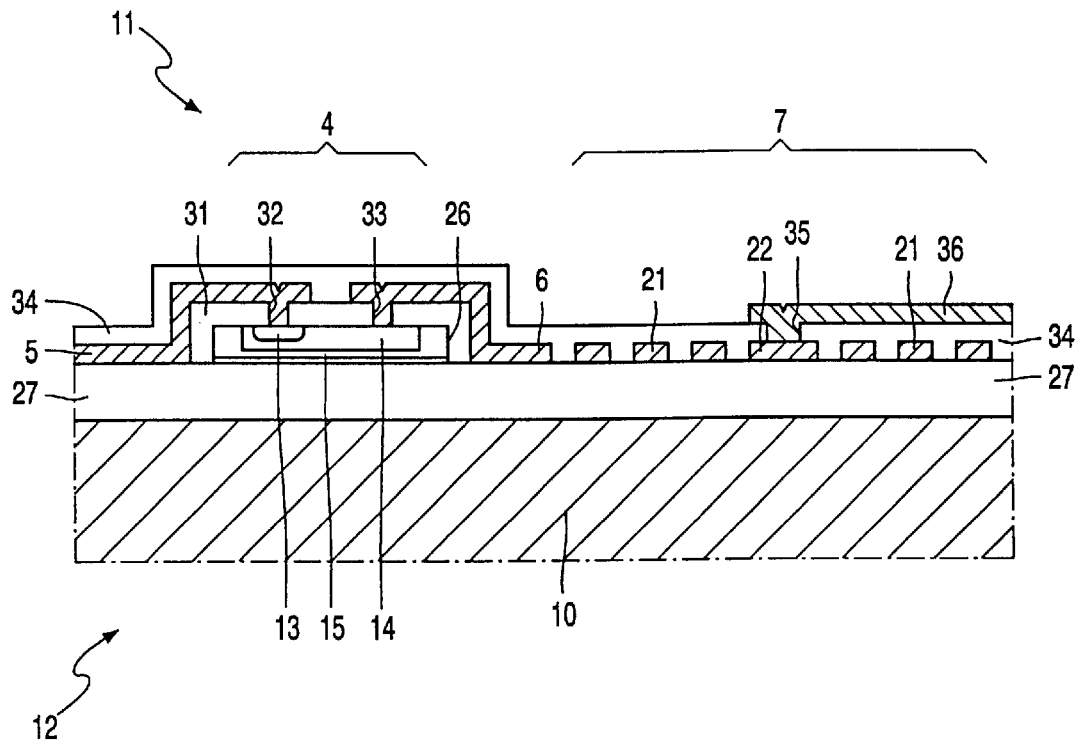
Figure 12:
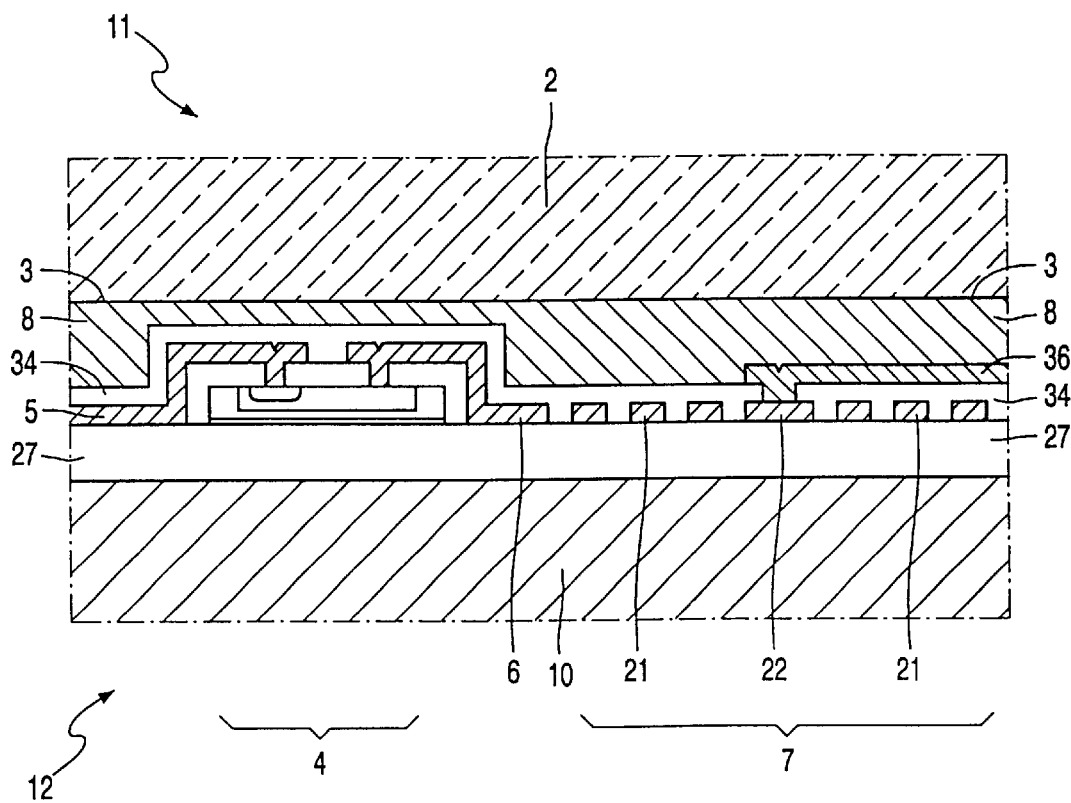

FIGS. 10 to 12 show in diagrammatic cross-sectional views successive stages in the manufacture of the semiconductor device 1 as shown in FIG. 2, having a body 2 of a soft ferrite material, which body 2 is provided at a surface 3 with a planar inductor 7, a pattern of conductors 5,6 and a semiconductor element 4, which semiconductor element 4 is formed in an insulated island 26 of semiconductor material. In the present example, the semiconductor device 1 is manufactured as a receiver for application in television apparatus with an operating frequency of about 450 MHz.

The manufacture starts (FIG. 10) with a body 10 of semiconductor material, in the present example a silicon body, which body 10 is provided at a first side 11 with an insulating layer 27, in the present example a layer composed of silicon oxide or silicon nitride with a thickness of about 0.4 $\mu$m, which insulating layer 27 is covered with a layer 28 of semiconductor material, in the present example a silicon layer of n-type conductivity with a thickness of about 2 $\mu$m. In the present example, the layer 28 of semiconductor material is applied as a double-layer comprising a comparatively lightly-doped second sub-layer 30 of silicon with a thickness of about 1 $\mu$m on top of a comparatively strongly-doped first sub-layer 29 of silicon with a thickness of about 1 $\mu$m as well. Published patent application WO 96/16443 describes ways of manufacturing a composite structure like that described above. Moreover, published patent application WO 96/20497 describes the application of a double- or multi-layer having insulating as well as passivating properties instead of the above-mentioned insulating layer 27.

In a next step, the body 10 of semiconductor material is provided at the first side 11 with the semiconductor element 4, the pattern of conductors 5,6 and the planar inductor 7, which may all be formed on the layer 28 of semiconductor material. However, in order to avoid a detrimental influence of the semiconductor material of the layer 28 on the performance of the planar inductor 7, it is preferred to form, in the layer 28 of semiconductor material, the above-mentioned insulated island 26 of semiconductor material provided with the semiconductor element 4, and to form, beside said insulated island 26, the planar inductor 7 directly on the insulating layer 27 (FIG. 11). The insulated island 26 of semiconductor material can be formed, for instance, by removing the layer 28 of semiconductor material next to the island 26 by means of etching, or by converting the layer 28 of semiconductor material next to the island 26 into insulating material, in the present example for instance silicon oxide. It is to be noted that the provision of the semiconductor element 4 can take place either before or after the formation of the insulated island 26 of semiconductor material.

In this way, the insulated island 26 of semiconductor material is formed so as to be provided with the semiconductor element 4, in the present example a bipolar transistor with an n-type emitter zone 13, a p-type base zone 14, and an n-type collector zone 15, which collector zone is provided by a portion of the layer 28 of semiconductor material situated below the base zone 14. The insulated island 26 of semiconductor material is subsequently provided with a further insulating layer 31 composed of, for instance, silicon oxide, in which further insulating layer 31 windows 32 and 33 are formed for contacting the emitter zone 13 and the base zone 14, respectively.

Subsequently, a layer of conductive material is deposited on the insulating layer 27, the further insulating layer 31 and in the windows 32 and 33, which layer of conductive material is etched to form the pattern of conductors 5,6. In this respect, aluminum, tungsten, copper or molybdenum, or a combination of metals may be used. Such a metal is advantageously applied on top of a layer acting as adhesion layer and/or barrier layer. In this respect titanium (Ti) may be applied as adhesion layer and titanium nitride (TiN) or titanium tungsten (TiW) as barrier layer. The planar inductor 7, in the present example a substantially circular spiral having a surface area of about 0.8 mm$^2$, may be formed in another layer of conductive material comprising, for instance, aluminum, copper, silver or gold, but is advantageously formed in the same layer of conductive material as the pattern of conductors 5,6, since no additional process steps are needed then. Aluminum, either pure or as an alloy with a few percent of silicon and/or copper, is advantageously applied in that case. The planar inductor 7 comprises turns 21, in the present example 5 turns 21 spaced apart about 5 $\mu$m and having a width of about 50 $\mu$m, and an end portion 22.

After the planar inductor 7, the pattern of conductors 5,6 and the semiconductor element 4 have been formed at the first side 11 of the body 10 of semiconductor material, another insulating layer 34 composed of, for instance, silicon oxide is applied in which a window 35 is formed through which the end portion 22 of the planar inductor 7 is connected to a conductor 36. The body 10 of semiconductor material is fastened with the first side 11 to the body 2 composed of a soft ferrite material by means of the layer 8 of adhesive, which may be, for instance, an epoxy or acrylate glue (FIG. 12). In the present example, the soft ferrite material is selected to be 4F1, which is a NiZn-ferrite having a ferromagnetic resonance frequency of about 90 MHz, a magnetic permeability of about 25 at the operating frequency of the semiconductor device 1 of about 450 MHz and an electric resistivity of about 10$^5$ $\Omega$m. It will be evident from the foregoing that other soft ferrite materials are applicable as well, provided their ferromagnetic resonance frequency is smaller than the operating frequency of the semiconductor device which, in the present example, is a receiver with an operating frequency of about 450 MHz for application in television apparatus.

Then, the body 10 of semiconductor material is subjected at the opposed, second side 12 to a material removing treatment until the semiconductor material is removed, at least at the area of the planar inductor 7. This can be achieved by providing the body 27 of semiconductor material at the second side 12 with an etching mask (not shown), which etching mask exposes at least the area of the planar inductor 7, and subsequently removing the exposed semiconductor material, in the present example silicon, by means of etching with a KOH solution until the insulating layer 27, in the present example composed of silicon oxide, is exposed. Etching stops automatically the moment the insulating layer 27 has been reached. The removal of the semiconductor material of the body 10 may be accelerated by maskless removal of the body 10 of semiconductor material over part of its thickness by means of, for instance, chemical-mechanical polishing before applying the above-mentioned etching mask, and subsequently etching the exposed semiconductor material.

However, in order to avoid a detrimental influence of the semiconductor material of the body 10 on the performance of the semiconductor element 4, it is preferred to remove the whole body 10 of semiconductor material during the above mentioned material removing treatment. To achieve this, the body 10 of semiconductor material is subjected at the second side 12 to a chemical-mechanical polishing treatment until the insulating layer 27 has been approached to within a few $\mu$m, after which an etching solution of KOH is applied to expose the insulating layer 27, which insulating layer 27 then acts as a stopping layer.

In all cases, the semiconductor material of the body 10 has been removed at the area of the planar inductor 7, which advantageously affects the quality factor of the planar inductor 7.

It will be apparent that the invention is not limited to the embodiments described above, but that many variations are possible to those skilled in the art within the scope of the invention. For example, besides the soft ferrite materials denoted by 4A15, 4F1 and 4E1, other soft ferrite materials can be advantageously applied in a semiconductor device in accordance with the invention, provided their ferromagnetic resonance frequency is smaller than the operating frequency of the semiconductor device. Examples of other applicable soft ferrite materials are, for instance, those denoted by 4A11, 3S3 and 2A3 in the Philips Components data handbook MA01 entitled "Soft Ferrites" (1998).

What is claimed is:

1. A semiconductor device with an operating frequency above 50 MHz comprising a body composed of a soft ferrite material, said body having a surface to which a semiconductor element, a pattern of conductors and a passive element are fastened, which passive element is shaped like an inductor, characterized in that the soft ferrite material has a ferromagnetic resonance frequency smaller than the operating frequency of the semiconductor device.

2. A semiconductor device as claimed in claim 1, characterized in that the soft ferrite material has a magnetic permeability larger than about 5 at the operating frequency of the semiconductor device.

3. A semiconductor device as claimed in claim 1, characterized in that the soft ferrite material has an electric resistivity larger than about 10$^3$ $\Omega$m.

4. A semiconductor device as claimed in claim 1, characterized in that the soft ferrite material comprises a NiZn-ferrite or a MgZn-ferrite.

5. A semiconductor device as claimed in claim 1, characterized in that the inductor is substantially planar.

6. A semiconductor device as claimed in claim 1, characterized in that the inductor has the form of a substantially circular spiral.

7. A semiconductor device as claimed in claim 1, characterized in that the inductor comprises aluminum.

8. A semiconductor device as claimed in claim 1 characterized in that the semiconductor element, the pattern of conductors and the passive element are fastened to the surface of the body composed of the soft ferrite material by means of layer of adhesive.

* * * * *